United States Patent [19]

Kodama et al.

[11] Patent Number: 4,547,865
[45] Date of Patent: Oct. 15, 1985

[54] MAGNETIC BUBBLE REPLICATOR

[75] Inventors: Naoki Kodama; Masatoshi Takeshita, both of Hachioji; Ryo Suzuki, Kodaira; Teruaki Takeuchi, Kokubunji; Yutaka Sugita, Tokorozawa, all of Japan

[73] Assignee: Hitachi, Ltd., Tokyo, Japan

[21] Appl. No.: 538,787

[22] Filed: Oct. 4, 1983

[30] Foreign Application Priority Data

Oct. 4, 1982 [JP] Japan ................. 57-173218

[51] Int. Cl.$^4$ .......................................... G11C 19/08
[52] U.S. Cl. ....................................... 365/12
[58] Field of Search ................................ 365/12, 16

[56] References Cited

U.S. PATENT DOCUMENTS

| 4,014,009 | 5/1977 | Bonyhard et al. | 365/12 |
| 4,020,476 | 4/1977 | Bonyhard et al. | 365/12 |
| 4,193,124 | 3/1980 | Bullock | 365/12 |

FOREIGN PATENT DOCUMENTS

| 0025833 | 2/1980 | Japan | 365/12 |
| 0011678 | 2/1981 | Japan | 365/16 |

OTHER PUBLICATIONS

IBM Technical Disclosure Bulletin-vol. 23, No. 5, Oct. 1980, p. 2113.

Primary Examiner—James W. Moffitt
Attorney, Agent, or Firm—Antonelli, Terry & Wands

[57] ABSTRACT

In a magnetic bubble replicator having a soft magnetic material element for propagating a magnetic bubble along an edge thereof in response to a change in a direction of an external magnetic field and a hairpin-shaped conductor superimposed on the soft magnetic material element, an angle between a slit of the conductor and a propagation path of the magnetic bubble of the soft magnetic material element is set to no less than 90 degrees, preferably 5-85 degrees, and more preferably to 45-60 degrees.

10 Claims, 8 Drawing Figures

MAGNETIC BUBBLE REPLICATOR

BACKGROUND OF THE INVENTION

The present invention relates to a magnetic bubble replicator which uses a soft magnetic material element and a hairpin-shaped conductor, in a magnetic bubble memory.

A prior art magnetic bubble memory uses a magnetic bubble replicator to assure non-volatility of the magnetic bubble memory. The replicator has a function to divide a magnetic bubble in a minor loop group stored as information into a magnetic bubble to be transferred to a detector for detection and a magnetic bubble to be retained in the minor loop group as the information.

A magnetic bubble memory of a block replicate scheme which uses replicators each for making a copy of magnetic bubble of a minor loop onto a major loop, has been known (U.S. Pat. No. 3,810,133).

In a magnetic bubble memory of a two-major line-minor loop group scheme as shown in FIG. 1, it is common to use replicators 7 as gates between a readout major line 8 and minor loop groups 6. In FIG. 1, numeral 1 denotes a biasing magnetic field applied perpendicularly to a surface of a magnetic thin film for retaining magnetic bubbles in the magnetic thin film, numeral 2 denotes a rotating magnetic field applied by a driving coil for driving the magnetic bubbles, numeral 3 denotes a bubble generator, numeral 4 denotes a write major line, numeral 5 denotes a swap gate and numeral 9 denotes a bubble detector.

In the magnetic bubble memory of the above type which uses a soft magnetic material, a replicator including a soft magnetic material element 12 and a hairpin-shaped conductor 10 as shown in FIG. 2 is used (U.S. Pat. No. 4,012,726). It is called a sideway replicator and fully utilizes an anisotropy of a pattern shape.

A magnetic bubble memory which uses the soft magnetic material (primarily permalloy) so far put into practice uses magnetic bubbles of 2 μm in diameter. Thus, a sufficient operation margin is provided by the sideway replicator.

The present inventors manufactured a replicator for the magnetic bubbles of 1 μm in diameter based on the above-mentioned sideway replicator and examined an operation characteristic. The result is shown in FIG. 3, in which an abscissa represents a strength of a rotating magnetic field to drive the magnetic bubbles and an ordinate represents a biasing magnetic field margin or an allowable range represented by percentage to a center of the allowable range, which is a range allowed to a biasing magnetic field applied perpendicularly to the magnetic thin film of the magnetic bubble chip to vary without causing an error in the magnetic bubble chip. When the rotating magnetic field is 60 Oe, the biasing magnetic field margin is 10% but when the rotating magnetic field is 50 Oe, the biasing magnetic field margin is 8%. This causes a problem in practical use.

It was found by the present inventor's experiment that a cause of the reduction of the biasing magnetic field margin is that, as shown in FIG. 4, a magnetic bubble 13 is not propagated through a crossing area of an upper side 12a of the soft magnetic material element 12 and the hairpin shaped conductor 10 and it is rebounded as shown by an arrow R.

SUMMARY OF THE INVENTION

It is an object of the present invention to provide a magnetic bubble replicator which prevents mispropagation of a magnetic bubble which occurs at the upper side of the soft magnetic material element which crosses the hairpin-shaped conductor.

Such mispropagation is a phenomenon which occurs at the crossing area of the soft magnetic material element and the conductor. Because the soft magnetic material element is disposed on the conductor with an insulating layer being interposed therebetween, the soft magnetic material element has a step and an attracting magnetic pole for driving the magnetic bubble is not fully developed on the upper side of the soft magnetic material element. This is a cause for the mispropagation. In the replicator for the magnetic bubbles of 2 μm in diameter, the biasing magnetic field for retaining the magnetic bubbles in the bubble material is relatively small and hence the reduction of the attracting magnetic pole at the step is small. In the replicator for the magnetic bubbles of 1 μm in diameter, however, the biasing magnetic field is large and the attracting magnetic pole is not fully developed at the step.

In the present invention, the soft magnetic material element and the hairpin-shaped conductor are arranged such that the upper side of the soft magnetic material element is not orthogonal to a slit of the hairpin-shaped conductor so that the attracting magnetic pole developed at the edge of the soft magnetic material element defined in the direction of propagation of the magnetic bubble is increased. In this manner, the mispropagation which would otherwise occur when the magnetic bubble is propagated through the soft magnetic material element from right to left, is prevented.

DESCRIPTION OF THE PREFERRED EMBODIMENT

Figure 1:
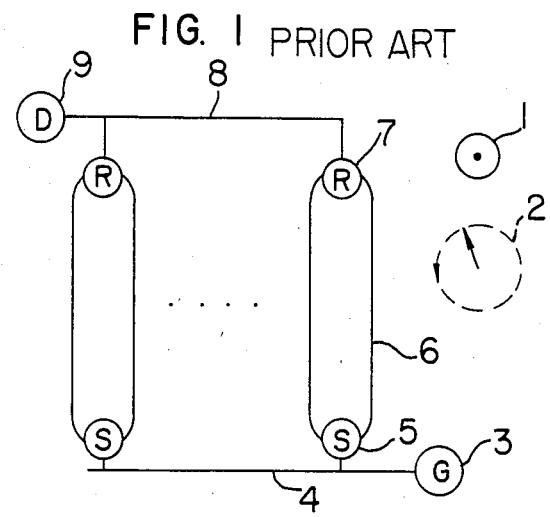
FIG. 1 shows a configuration of two-major line-minor loop scheme magnetic bubble memory having replicators.
Figure 3:
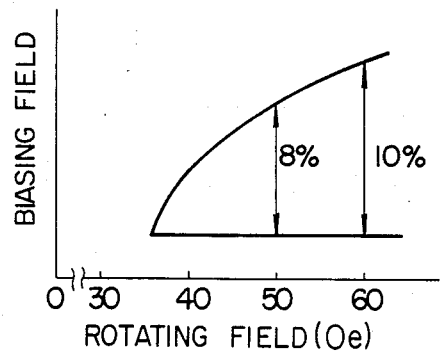
FIG. 3 shows an operation margin of a replicator for magnetic bubble of 1 μm in diameter.
Figure 4:
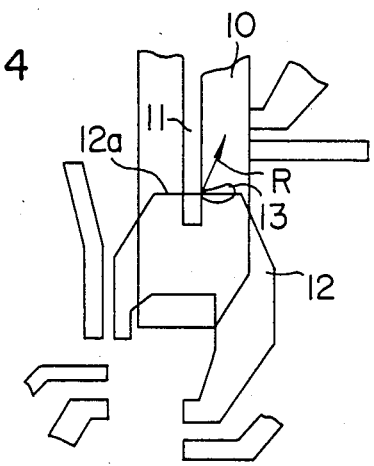
FIG. 4 illustrates mispropatation which occurs when a biasing magnetic field exceeds an upper limit.
Figure 2:
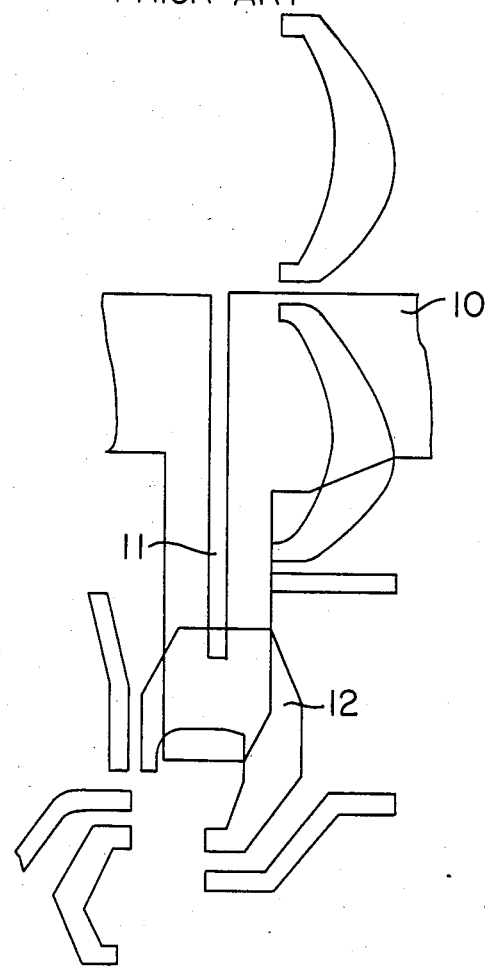
FIG. 2 shows a sideway replicator.
Figure 5:
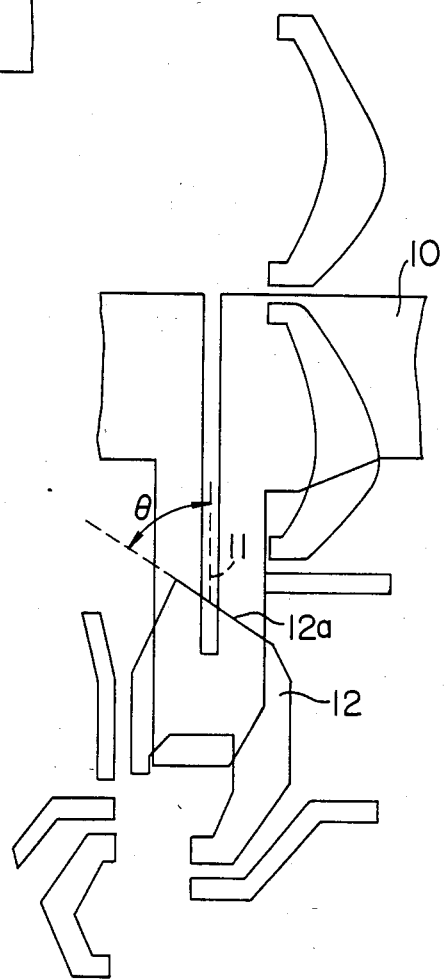
FIG. 5 shows a replicator according to one embodiment of the present invention.
Figure 6:
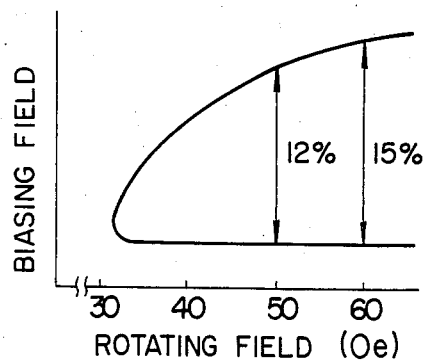
FIG. 6 shows an operation margin of the replicator shown in FIG. 5.

Referring to FIG. 5, a replicator according to one embodiment of the present invention is explained. As shown in the figure, an angle $\theta$ between a slit 11 of a hairpin-shaped conductor 10 and a direction of propagation of a bubble (direction along an upper side 12a of a soft magnetic material element 12) is set to 60 degrees. A biasing magnetic field margin of the replicator of the present embodiment is shown in FIG. 6. The margin is 12% at a rotating magnetic field of 50 Oe. It is thus practically sufficient.

Figure 7:
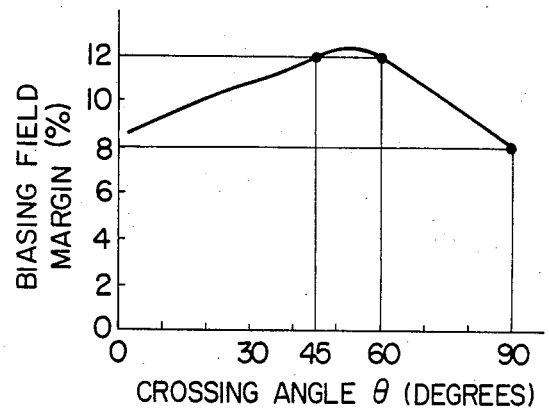
FIG. 7 shows a relation between a crossing angle $\theta$ and an operation margin.

FIG. 7 shows a relation between the angle $\theta$ and the biasing magnetic field margin at the rotating magnetic field of 50 Oe. The margin is minimum, 8%, when the angle θ between the direction of propagation of bubble at the upper side 12a of the soft magnetic material element and the slit 11 of the hairpin-shaped conductor 10 is 90 degrees, which is the case in the prior art. Accordingly, the angle θ is to be less than 90 degrees. Particularly, the highest margin (higher than 12%) is attained when the angle θ is between 45 degrees and 60 degrees.

Figure 8:
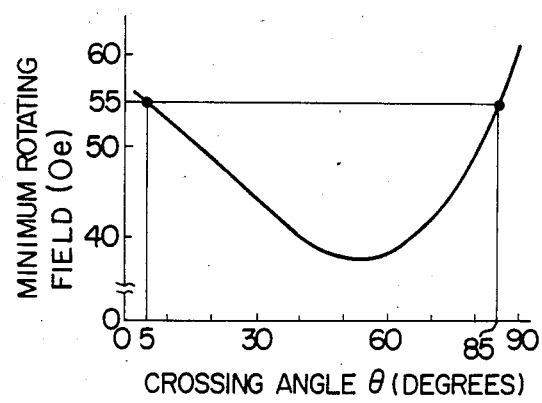
FIG. 8 shows a relation between the crossing angle $\theta$ and a minimum rotating magnetic field.

In order to use the element in a practical device, it is preferable that the biasing magnetic field margin is no less than 10%. FIG. 8 shows a relation between a minimum rotating magnetic field necessary to assure the 10% margin and the crossing angle θ. It is seen from FIG. 8 that when the crossing angle θ is between 5 degrees and 85 degrees, the minimum rotating magnetic field necessary to assure the 10% biasing magnetic field margin is no more than 55 Oe. Beyond the above range for the angle θ, the minimum rotating magnetic field required exceeds 55 Oe and it is not practical. When the rotating magnetic field exceed 55 Oe, heat generated by a coil for generating the rotating magnetic field abruptly increases and it is not practical. Accordingly, a preferred range of the angle θ for practical use is between 5 degrees and 85 degrees.

The present invention provides a replicator for the magnetic bubble of 1 μm in diameter, having a practically acceptable biasing magnetic field margin. The present invention can also be applied to a magnetic bubble memory which uses propagation tracks made by ion implantation and propagation tracks made by a soft magnetic material.

The present invention is also effective to a replicator using the soft magnetic material for magnetic bubble of less than 1 μm in diameter because of the increased biasing magnetic field.

We claim:

1. A magnetic bubble replicator comprising:
   a soft magnetic material element for propagating a magnetic bubble along a predetermined edge thereof in response to a change in a direction of an external magnetic field; and
   a hairpin-shaped conductor arranged in superposition to said soft magnetic material element, an angle between a slit of said hairpin-shaped conductor and a path of propagation of the magnetic bubble of said soft magnetic material element being selected to be between 45 degrees and 60 degrees.

2. A magnetic bubble replicator according to claim 1, wherein said angle is between 50 degrees and 55 degrees.

3. A magnetic bubble replicator according to claim 1, wherein said predetermined edge of said soft magnetic material element along which the magnetic bubble propagates is disposed so as to extend across the slit of said hairpin-shaped conductor at said angle in the direction of propagation.

4. A magnetic bubble replicator according to claim 3, wherein the slit of said hairpin-shaped conductor is delimited by parallel side surfaces of said hairpin-shaped conductor.

5. A magnetic bubble replicator according to claim 1, wherein the magnetic bubble to be propagated along said predetermined edge has a diameter no greater than 1 μm.

6. A magnetic bubble replicator according to claim 5, wherein the magnetic bubble to be propagated along said predetermined edge has a diameter less than 1 μm.

7. A magnetic bubble replicator comprising:
   a soft magnetic material element for propagating a magnetic bubble having a diameter no greater than 1 μm in diameter along a predetermined edge thereof in response to a change in a direction of an external magnetic field;
   a hairpin-shaped conductor arranged in superposition to said soft magnetic material element; and
   means for preventing mispropagation of the magnetic bubble at the said predetermined edge of said soft magnetic material element, said mispropagation preventing means including disposing said predetermined edge of said soft magnetic material element so as to extend across the slit of said hairpin-shaped conductor in the direction of the path of propagation of the magnetic bubble at an angle between the slit of said hairpin-shaped conductor and the predetermined edge of between 45 degrees and 60 degrees.

8. A magnetic bubble replicator according to claim 7, wherein the magnetic bubble to propagated is less than 1 μm in diameter.

9. A magnetic bubble replicator according to claim 8, wherein said angle is between 50 degrees and 55 degrees.

10. A magnetic bubble replicator according to claim 8, wherein the slit of said hairpin-shaped conductor is delimited by parallel side surfaces of said hairpin-shaped conductor.

* * * * *

UNITED STATES PATENT AND TRADEMARK OFFICE
CERTIFICATE OF CORRECTION

PATENT NO. : 4,547,865

DATED : October 15, 1985

INVENTOR(S) : Naoki Kodama et al.

It is certified that error appears in the above—identified patent and that said Letters Patent is hereby corrected as shown below:

IN THE TITLE PAGE:

Column 2    ABSTRACT

Line 8, delete "no"

Signed and Sealed this

Eighth    Day of    April 1986

[SEAL]

Attest:

DONALD J. QUIGG

Attesting Officer    Commissioner of Patents and Trademarks